United States Patent [19]

Pradel

[11] Patent Number: 5,228,951
[45] Date of Patent: Jul. 20, 1993

[54] METHOD FOR EMBODYING TWIN-CONNECTION INTEGRATED CIRCUITS

[75] Inventor: Denis Pradel, Pierrelaye, France

[73] Assignee: Societe D'Applications Generales D'Electricite et de Mecanique Sagem, Paris, France

[21] Appl. No.: 770,348

[22] Filed: Oct. 3, 1991

[30] Foreign Application Priority Data

Oct. 18, 1990 [FR] France .................. 90 12908

[51] Int. Cl.$^5$ .............. B44C 1/22; C03C 15/00; C03C 25/06
[52] U.S. Cl. .................. 156/657; 156/644; 437/195
[58] Field of Search ........... 156/657, 659.1, 662, 156/644; 437/209, 228, 238; 357/68

[56] References Cited

U.S. PATENT DOCUMENTS 4,860,087 8/1989 Matsubara .................. 357/68

FOREIGN PATENT DOCUMENTS 402592 12/1990 European Pat. Off. .
60-130153 7/1985 Japan .

OTHER PUBLICATIONS

"Alternative Bonding Methods for Chip-on-Board Technology", 36th Electronic Components Conference, ITT Technology Division, Richard Landis, May 5–7, 1986, pp. 53–58.

*Primary Examiner*—William A. Powell
*Attorney, Agent, or Firm*—Oblon, Spivak, McClelland, Maier & Neustadt

[57] ABSTRACT

A method is disclosed for a forming integrated circuit on a semiconductor chip, said semiconductor chip having the first surface having a central region and a peripheral region including forming more than one contact region on each line connecting two active regions of the semiconductor chip.

11 Claims, 1 Drawing Sheet

METHOD FOR EMBODYING TWIN-CONNECTION INTEGRATED CIRCUITS

FIELD OF THE INVENTION

The present invention concerns a method for embodying twin-connection integrated circuits and is applicable to the technique relating to integrated circuits and in particular for embodying the control circuits of display screens, especially liquid crystal display screens.

BACKGROUND OF THE INVENTION

The integration of electronic circuits raises, apart from other problems, that of embodying electric connections between the integrated circuit and the outside world. This technique concerning connections is nowadays known under the term of "connection processing". The more the integration density increases, the larger are the number of inputs/outputs required and the more difficult is the problem concerning connection processing.

There currently exist a number of techniques making it possible to establish these connections, such as the TAB technique ("Tape Automated Bonding" technique). It consists of forming conductive blocks, distributed around the active zone of the chip and connected to the electronic circuits installed in the latter, and being welded to conductive tabs on these conductive blocks.

A detailed description of this technique appears in the publication published by S.M. SZE and entitled "VLSI Technology", McGraw-Hill International Book Company.

In certain cases, especially for circuits having a high integration density, it is preferable to avoid using intermediate links but make use of the COG ("Chip On Glass" technique or even the COX ("Chip On X") technique. According to this technique, the chip is mounted, by multiple bondings or soldering joints by remelt heating, directly on the glass support (or on the ceramic support or any other compatible material, including the special printed circuits).

For a given integrated circuit, the type of connection processing is determined in advance and embodied during the method for embodying the circuit. The metallic blocks are produced during the final production operations, especially during a metallization operation. A passivation film (of oxides, nitrides, polyamides or other substances) is then deposited on the unit and, by means of etching, the conductive blocks are freed so that the connections can next be made.

The applications of a given integrated circuit are thus determined, not merely by the electronic functions fulfilled by this circuit, but also by the selected connection processing. Here, there is a single limitation to the extent that an integrated circuit with given electronic functions could in certain cases be used for other applications if it has another connection processor (such as a COG connection processor instead of a TAB connection processor).

SUMMARY OF THE INVENTION

The object of the present invention is to resolve this drawback.

To this end, the invention offers an embodiment method which provides several possibilities of connection until the final operation defining which variant or variants are to be retained. It is then possible to embody integrated circuits able to be used for different applications by means of a sole production method, only the final stage for etching the passivation film being specific concerning the finally selected connection processing. Accordingly, production costs and leadtimes are reduced.

More specifically, the object of the present invention is to provide a method for embodying an integrated circuit and its connection processing means, said method including operations for forming an active zone in the central portion of a semiconductive chip and operations for forming conductive connection blocks distributed around said active zone, this method being characterized by the fact that by means of said operations for forming the conductive blocks :

a first series of conductive blocks is formed at the periphery of the chip, these blocks having a structure adapted to the Tape Automated Bonding technique, a second series of conductive blocks is formed between the first series and the central zone of the chip, these blocks having a structure adapted to the COG or COX technique, the entire chip is coated with a passivation film, this passivation film is etched so as to free at least one of the two series of conductive blocks according to the finally desired connection processing.

According to the invention, it is possible to free either the TAB blocks, the COG (or COX) blocks, or both the TAB and COG (or COX) blocks.

In one advantageous variant, so as to avoid any degradation of the TAB or COX blocks, a third series of conductive blocks is also formed, this series having a structure adapted to the test under point technique, the etching of the passivation film thus freeing at least one of the three series of blocks. The third series of blocks is not freed if the under points test has been carried out prior to passivation and is freed if the under points test is carried out after passivation.

BRIEF DESCRIPTION OF THE DRAWINGS

The characteristics and advantages of the invention shall appear more readily from a reading of the following description of a non-restrictive example of an embodiment, given purely by way of explanation, with reference to the accompanying drawings on which.

DETAILED DESCRIPTION OF THE PREFERRED EMBODIMENTS

Figure 1:
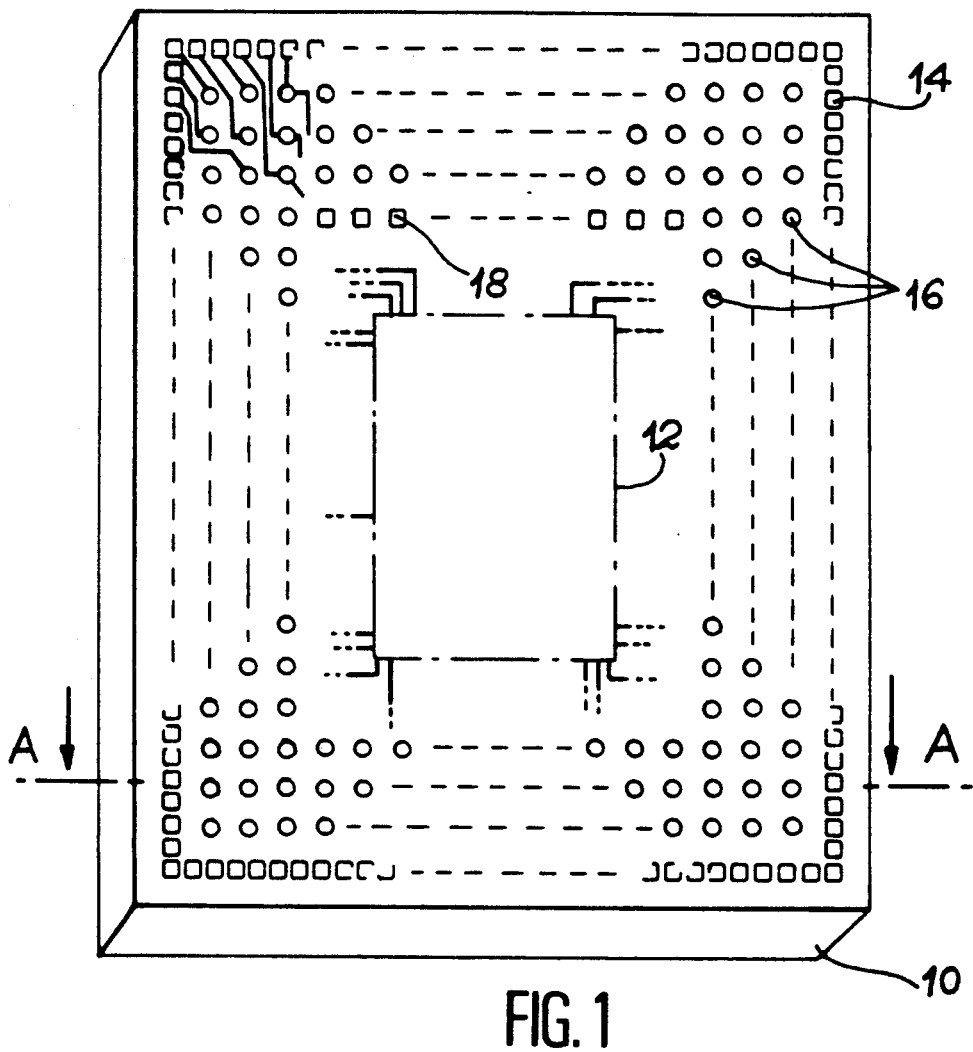
FIG. 1 diagrammatically shows a top view of an integrated circuit embodied according to the method of the invention.

For the sake of providing clarity, it goes without saying that the accompanying drawings are not to scale. First of all, FIG. 1 shows a rectangular (or possibly square) chip 10 including in its central portion an active zone 12 where the circuits are implanted. At the periphery of the chip, there is a row 14 of TAB blocks and, between the row 14 and the circuit 12, rows (such as three) of COG (or COX) blocks, reference 16, are disposed. Finally, an alignment of blocks 18 is provided for the under point test. This third series may occupy one of the sides of the chip.

The blocks of the row 14 are connected to the blocks of rows 16 by conductive lines (not shown) or otherwise diagrammatically shown in the upper left corner of FIG. 1.

Figure 2:
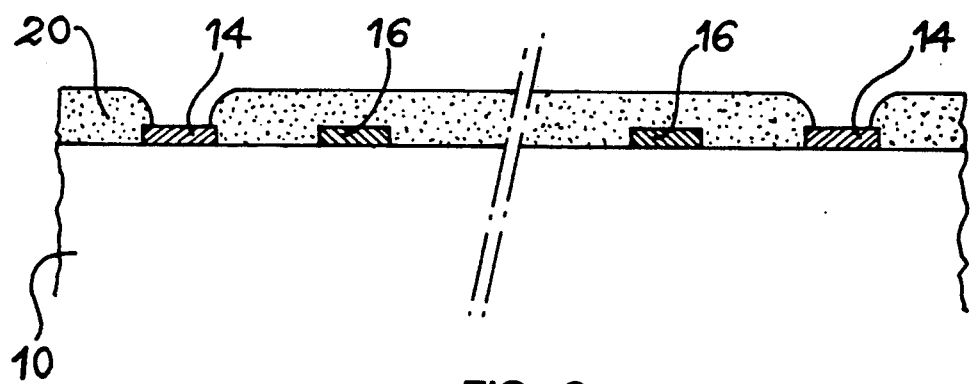
FIG. 2 diagrammatically shows the final stage of the method of the invention.

FIG. 2, which corresponds to a section along a row of COG blocks, further shows the passivation film 20 which, in the case illustrated, has been etched solely at the location of the TAB blocks 14 (the COG blocks 16 not having been freed).

What is claimed is:

1. A method for forming an integrated circuit on a semiconductor chip, said semiconductor chip having a first surface having a central region and a peripheral region, comprising the steps of:

forming an active region in the central region;

depositing a first conductive region above the peripheral region and a first conductive line electrically connecting the first conductive region to the active region;

coating the first surface with a passivation layer;

removing the passivation layer from only first and second contact regions of the first conductive region.

2. A method according to claim 1, where the first contact region is rectangular.

3. A method according to claim 1, wherein the second contact region is rectangular.

4. A method according to claim 1, wherein the second contact region is circular.

5. A method according to claim 1, further comprising the steps of:

depositing a second conductive region on the peripheral region and a second conductive line electrically connecting the second conductive region to the active region prior to the step of coating the first surface with a passivation layer;

removing the passivation layer from only spatially separate third and fourth contact regions of the second conductive region.

6. A method according to claim 5, wherein the third contact region is rectangular.

7. A method according to claim 5, wherein the fourth contact region is rectangular.

8. A method according to claim 5, wherein the fourth contact region is circular.

9. A method according to claim 1, further comprising the step of removing the passivation layer from a third contact region of the first conductive region, said third contact region being spatially separate from the first and second contact regions of the first conductive region.

10. A method for forming an integrated circuit on a semiconductor chip, said semiconductor chip having a first surface having a central region and a peripheral region, comprising the steps of:

forming an active region in the central region;

depositing first conductive regions on the peripheral region and first conductive lines electrically connecting the first conductive regions to the active region;

coating the first surface with a passivation layer;

removing the passivation layer from only spatially separate first and second contact regions of each of the first conductive regions; and wherein the first contact regions are disposed at positions defining a first rectangular pattern.

11. A method according to claim 10, wherein the second contact regions are disposed at positions defining a second rectangular pattern which is inside the first rectangular pattern.

* * * * *